(12) United States Patent
Kim et al.

(10) Patent No.: US 10,431,887 B2
(45) Date of Patent: Oct. 1, 2019

(54) ELECTRONIC DEVICE WITH ELECTROMAGNETIC SHIELDING MEMBER

(71) Applicant: Samsung Electronics Co., Ltd., Gyeonggi-do (KR)

(72) Inventors: Jun-Young Kim, Gyeonggi-do (KR); Sang-Seob Kim, Gyeonggi-do (KR); Min Park, Gyeonggi-do (KR); Jung-Je Bang, Gyeonggi-do (KR); Beom-Ju Kim, Gyeonggi-do (KR); Jae-Heung Ye, Gyeonggi-do (KR); Yong-Won Lee, Gyeonggi-do (KR); Jung-Sik Park, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 15/807,094

(22) Filed: Nov. 8, 2017

(65) Prior Publication Data

US 2018/0131087 A1    May 10, 2018

(30) Foreign Application Priority Data

Nov. 8, 2016    (KR) .................. 10-2016-0148150

(51) Int. Cl.
*H05K 7/00*    (2006.01)
*H01Q 1/52*    (2006.01)
(Continued)

(52) U.S. Cl.
CPC ........... *H01Q 1/526* (2013.01); *G06F 3/0412* (2013.01); *H01L 23/552* (2013.01); *H01Q 1/2283* (2013.01); *H01Q 1/48* (2013.01); *H05K 1/111* (2013.01); *H05K 1/147* (2013.01); *H05K 1/181* (2013.01); *H05K 9/0024* (2013.01); *H05K 9/0026* (2013.01); *G06F 3/044* (2013.01); *G06F 3/0414* (2013.01); *H01Q 1/243* (2013.01); *H01Q 9/42* (2013.01); *H04M 1/0266* (2013.01); *H04M 1/0277* (2013.01); *H04M 1/03* (2013.01);
(Continued)

(58) Field of Classification Search
CPC ........ H01Q 1/243; H01Q 1/526; H01K 1/181; H01K 9/0024; H01K 1/111; H01K 1/147
See application file for complete search history.

(56) References Cited

U.S. PATENT DOCUMENTS 6,201,501 B1 * 3/2001 Arkko .................... H01Q 1/243
343/700 MS
6,243,592 B1 * 6/2001 Nakada .................. H01Q 1/243
455/575.7
(Continued)

FOREIGN PATENT DOCUMENTS

JP    2011-018873    1/2011
JP    2016146401 A *  8/2016
(Continued)

*Primary Examiner* — Dieu Hien T Duong
(74) *Attorney, Agent, or Firm* — The Farrell Law Firm, P.C.

(57) ABSTRACT

An electronic device is provided. The electronic device includes a housing including a radiating conductor forming a portion of a side wall thereof, an electronic component disposed adjacent to the radiating conductor, a circuit board including an integrated circuit (IC) chip, and a shielding member attached to the circuit board and surrounding the IC chip.

20 Claims, 9 Drawing Sheets

(51) Int. Cl.
  *H05K 1/18* (2006.01)
  *H05K 9/00* (2006.01)
  *H05K 1/11* (2006.01)
  *H05K 1/14* (2006.01)
  *G06F 3/041* (2006.01)
  *H01Q 1/48* (2006.01)
  *H01Q 1/22* (2006.01)
  *H01L 23/552* (2006.01)
  *H04M 1/02* (2006.01)
  *H01Q 1/24* (2006.01)
  *G06F 3/044* (2006.01)
  *H04M 1/03* (2006.01)
  *H01Q 9/42* (2006.01)
  *H05K 1/02* (2006.01)

(52) U.S. Cl.
  CPC ..... *H05K 1/0218* (2013.01); *H05K 2201/042* (2013.01); *H05K 2201/056* (2013.01); *H05K 2201/0715* (2013.01); *H05K 2201/10128* (2013.01); *H05K 2201/10151* (2013.01)

(56) References Cited

U.S. PATENT DOCUMENTS

| | | | |
|---|---|---|---|
| 2003/0112616 A1* | 6/2003 | Doi | H05K 1/0218 361/818 |
| 2010/0294559 A1* | 11/2010 | Izawa | H05K 9/0024 174/378 |
| 2014/0028518 A1* | 1/2014 | Arnold | H01Q 1/526 343/841 |
| 2015/0116607 A1* | 4/2015 | Cheng | H05K 5/02 349/12 |
| 2015/0187845 A1* | 7/2015 | Kim | H01L 27/323 257/40 |
| 2015/0201535 A1 | 7/2015 | Su | |
| 2017/0013749 A1 | 1/2017 | Nam et al. | |

FOREIGN PATENT DOCUMENTS

| | | |
|---|---|---|
| KR | 10-1425179 | 7/2014 |
| KR | 10-1588870 | 1/2016 |

\* cited by examiner

ELECTRONIC DEVICE WITH ELECTROMAGNETIC SHIELDING MEMBER

PRIORITY

This application claims priority under 35 U.S.C. § 119(a) to Korean Patent Application Serial No. 10-2016-0148150, which was filed in the Korean Intellectual Property Office on Nov. 8, 2016, the entire content of which is incorporated herein by reference.

BACKGROUND

1. Field of the Disclosure

The present disclosure relates generally to an electronic device, and more particularly, to an electronic device including a shielding member that prevents electromagnetic wave interference.

2. Description of the Related Art

Conventional electronic devices (e.g., an electronic scheduler, a portable multimedia reproducer, a mobile communication terminal, a tablet PC, an image/sound device, a desktop/laptop PC, a home appliance or a vehicular navigation system) are configured to perform one or more functions according to the various programs or applications installed thereon. For example, an electronic device may output information stored thereon as sound or an image. As the degree of integration of electronic devices has increased, and super-high speed and large capacity wireless communication has become popular, various functions have recently been provided for use in these electronic devices (e.g., in a single mobile communication terminal). For example, an entertainment function (e.g., a game function), a multimedia function (e.g., a music/video reproducing function), a communication and security function for mobile banking, a schedule management function, and an e-wallet function can be integrated, in addition to a communication function that these electronic device usually perform.

As can be appreciated, as the degree of integration of electronic devices increases, the electronic components mounted on a circuit board of the electronic devices are often miniaturized, so that the performance of these electronic components can be improved. The electronic components may be manufactured in the form of an integrated circuit (IC) chip in which one circuit device (e.g., a processor, an audio module, a power management module, or a wireless frequency module) is incorporated, or in the form in which a plurality of circuit devices are integrated in a single IC.

Moreover, portable electronic devices, such as mobile communication terminals, may be equipped with various types of antenna devices to ensure a connection can be made to one or more wireless networks. For example, a portable electronic device may include various antenna devices so that the portable electronic device can connect networks having different operating frequency bands, e.g., near field communication (NFC), bluetooth (BT), a wireless local area network (LAN), and a commercial wireless network (e.g., a 3G or 4G mobile communication network).

However, various IC chips with increased integration may generate additional electromagnetic waves, and the interference of these electromagnetic waves may degrade a performance of the IC chips and/or an overall performance of an electronic device. For example, in a mobile communication terminal that is routinely carried and used, IC chips may be arranged more densely, and may be disposed adjacent to an antenna device (e.g., a radiating conductor). However, such an arrangement may deteriorate an operating performance of the IC chips and/or an operating environment of the antenna devices.

SUMMARY

The present disclosure has been made to address at least the disadvantages described above and to provide at least the advantages described below.

Accordingly, an aspect of the present disclosure provides an electronic device including a shielding member capable of mitigating or preventing electromagnetic wave interference between ICs and/or between the IC chips and electronic components of the electronic device, such as an antenna device or a speaker.

An aspect of the present disclosure provides an electronic device including a shield member that stably maintains a state of being connected to a ground of a circuit board.

An aspect of the present disclosure provides an electronic device including a shielding member in which a circuit board and/or an IC chip may also be easily disposed even in a narrow space, thereby improving the degree of design freedom.

In accordance with an aspect of the present disclosure, there is provided an electronic device. The electronic device includes a housing including a radiating conductor forming a portion of a side wall thereof, an electronic component disposed adjacent to the radiating conductor, a circuit board including an (IC) chip, and a shielding member attached to the circuit board and surrounding the IC chip.

In accordance with an aspect of the present disclosure, there is provided a method for manufacturing an electronic device. The method includes forming radiating conductor in a portion of a side wall of a housing of the electronic device, attaching an electronic component to the housing adjacent to the radiating conductor, and attaching a shielding member connected to a circuit board including an integrated circuit (IC) chip to the housing such that shielding member surrounds the IC chip.

BRIEF DESCRIPTION OF THE DRAWINGS

The above and other aspects, features and advantages of certain embodiments of the present invention will be more apparent from the following detailed description taken in conjunction with the accompanying drawings, in which.

DETAILED DESCRIPTION

Figure 1:
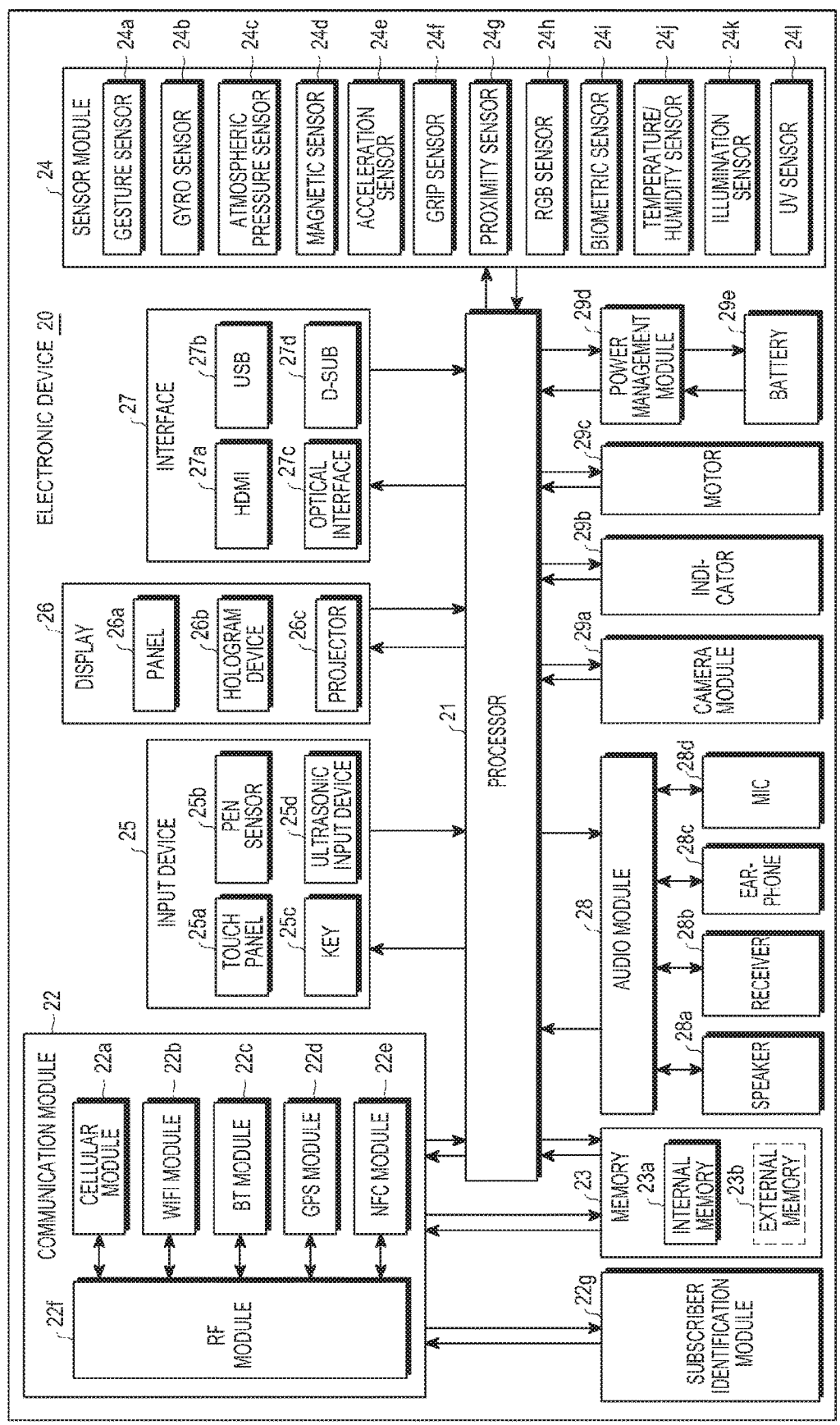
FIG. 1 is a block diagram of an electronic device, according to an embodiment of the present disclosure.

Embodiments of the present disclosure will be described herein below with reference to the accompanying drawings. However, the embodiments of the present disclosure are not limited to the specific embodiments and should be construed as including all modifications, changes, equivalent devices and methods, and/or alternative embodiments of the present disclosure. In the description of the drawings, similar reference numerals are used for similar elements.

The terms "have," "may have," "include," and "may include" as used herein indicate the presence of corresponding features (for example, elements such as numerical values, functions, operations, or parts), and do not preclude the presence of additional features.

Further, the terms "a front surface", "a rear surface", "a top surface", "a bottom surface", etc., which are described with respect to the orientation in the drawings, may be replaced by ordinal numbers such as first and second. The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may modify various elements regardless of an order and/or importance of the corresponding elements, and do not limit the corresponding elements. These terms may be used for the purpose of distinguishing one element from another element. For example, a first user device and a second user device may indicate different user devices regardless of the order or importance. For example, a first element may be referred to as a second element without departing from the scope the present invention, and similarly, a second element may be referred to as a first element.

When an element (e.g. a first element) is "(operatively or communicatively) coupled with/to" or "connected to" another element (e.g. a second element), the first element may be directly coupled with/to the second element, or there may be an intervening element (e.g. a third element) between the first element and the second element. To the contrary, when the first element is "directly coupled with/to" or "directly connected to" the second element, there is no intervening element therebetween.

The expression "configured to (or set to)" as used herein may be used interchangeably with "suitable for," "having the capacity to," "designed to," "adapted to," "made to," or "capable of" according to a context. The term "configured to (set to)" does not necessarily mean "specifically designed to" in a hardware level. Instead, the expression "apparatus configured to . . . " may mean that the apparatus is "capable of . . . " along with other devices or parts in a certain context.

For example, "a processor configured to (set to) perform A, B, and C" may mean a dedicated processor (e.g., an embedded processor) for performing a corresponding operation, or a generic-purpose processor (e.g., a CPU or an application processor) capable of performing a corresponding operation by executing one or more software programs stored in a memory device.

The terms used in describing the various embodiments of the present disclosure are used for the purpose of describing particular embodiments and are not intended to limit the present disclosure.

As used herein, the singular forms are intended to include the plural forms as well, unless the context clearly indicates otherwise.

All of the terms used herein including technical or scientific terms have the same meanings as those generally understood by an ordinary skilled person in the related art unless they are defined otherwise. The terms defined in a generally used dictionary should be interpreted as having the same or similar meanings as the contextual meanings of the relevant technology and should not be interpreted as having ideal or exaggerated meanings unless they are clearly defined herein. According to circumstances, even the terms defined in this disclosure should not be interpreted as excluding the embodiments of the present disclosure.

The term "module" as used herein may, for example, mean a unit including one of hardware, software, and firmware or a combination of two or more of them. The term "module" may be interchangeably used with, for example, the term "unit", "logic", "logical block", "component", or "circuit". A "module" may be a minimum unit of an integrated component element or a part thereof. A "module" may be a minimum unit for performing one or more functions or a part thereof. A "module" may be mechanically or electronically implemented. For example, a "module" according to the present invention may include at least one of an application-specific IC (ASIC) chip, a field-programmable gate arrays (FPGA), and a programmable-logic device for performing operations which has been known or are to be developed hereinafter.

An electronic device according to the present disclosure may include at least one of a smart phone, a tablet personal computer (PC), a mobile phone, a video phone, an electronic book reader (e-book reader), a desktop PC, a laptop PC, a netbook computer, a workstation, a server, a personal digital assistant (PDA), a portable multimedia player (PMP), a MPEG-1 audio layer-3 (MP3) player, a mobile medical device, a camera, and a wearable device. The wearable device may include at least one of an accessory type device (e.g., a watch, a ring, a bracelet, an anklet, a necklace, a glasses, a contact lens, or a head-mounted device (HMD)), a fabric or clothing integrated type device (e.g., an electronic clothing), a body-mounted type device (e.g., a skin pad, or tattoo), and a bio-implantable type device (e.g., an implantable circuit).

The electronic device may be a home appliance. The home appliance may include at least one of, a television, a digital video disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

The electronic device may include at least one medical device (e.g., a portable medical measuring device such as a blood glucose monitoring device, a heart rate monitoring device, a blood pressure measuring device, a body temperature measuring device, etc., a magnetic resonance angiography (MRA) device, a magnetic resonance imaging (MRI) device, a computed tomography (CT) machine, and an ultrasonic machine), a navigation device, a global positioning system (GPS) receiver, an event data recorder (EDR), a flight data recorder (FDR), a vehicle infotainment device, an electronic device for a ship (e.g., a navigation device for a ship, and a gyro-compass), avionics, a security device, an automotive head unit, a robot for home or industry, an automatic teller machine (ATM) in banks, point of sales (POS) device or an Internet of Things (IoT) device (e.g., a light bulb, various sensors, electric or gas meter, a sprinkler device, a fire alarm, a thermostat, a streetlamp, a toaster, a sporting goods, a hot water tank, a heater, a boiler, etc.).

The electronic device may include at least one of a part of furniture or a building/structure, an electronic board, an electronic signature receiving device, a projector, and various kinds of measuring instruments (e.g., a water meter, an electric meter, a gas meter, and a radio wave meter). The electronic device may also be a flexible device. The electronic device may be a combination of one or more of the aforementioned various devices. Further, the electronic device is not limited to the aforementioned devices, and may include an electronic device according to the development of new technology.

The electronic device may communicate with an external electronic device, such as a server or perform an operation through an interworking with the external electronic device. For example, the electronic device may transmit an image photographed by a camera and/or position information detected by a sensor unit to the server through a network. The network may be a mobile or cellular communication network, a LAN, a wireless local area network (WLAN), a WAN, an internet, a small area network (SAN), etc. but is not limited thereto.

Herein, the term "user" may indicate a person using an electronic device or a device (e.g., an artificial intelligence electronic device) using an electronic device.

FIG. 1 is a block diagram of an electronic device 20, according to an embodiment of the present disclosure. The electronic device 20 includes a processor (e.g., application processor (AP)) 21, a communication module 22, a subscriber identification module (SIM) 22g, a memory 23, a sensor module 24, an input device 25, a display 26, an interface 27, an audio module 28, a camera module 29a, a power management module 29d, a battery 29e, an indicator 29b, and a motor 29c.

The processor 21 may drive an operating system (OS) or an application program to control a plurality of hardware or software components connected thereto, and may also perform various data processing and arithmetic operations. The processor 21 may be implemented by a system-on-chip (SoC). The processor 21 may further include a graphic processing unit (GPU) and/or an image signal processor. The processor 21 may include at least some components (e.g., a cellular module 22a) among the components illustrated in FIG. 1. The processor 21 may load a command or data received from at least one of the other components (e.g., a non-volatile memory) in a volatile memory to process the command and data, and may store result data in a non-volatile memory.

The communication module 22 includes the cellular module 22a, a wireless-fidelity (WiFi) module 22b, a BT module 22c, a global navigation satellite system (GNSS) module 22d, an NFC module 22e, and a radio frequency (RF) module 22f. The cellular module 22a may provide a voice call, a video call, a message service, or an internet service through a communication network. The cellular module 22a may perform discrimination and authentication of the electronic device 20 within the communication network by using the SIM 22g. The cellular module 22a may perform at least some of the functions that may be provided by the processor 21. The cellular module 22a may include a communication processor (CP). At least some (e.g., two or more) of the cellular module 22a, the WiFi module 22b, the BT module 22c, the GNSS module 22d, and the NFC module 22e may be incorporated in a single IC chip or an IC package.

The RF module 22f may transmit/receive a communication signal (e.g., an RF signal). The RF module 22f may include a transceiver, a power amp module (PAM), a frequency filter, a low noise amplifier (LNA), or an antenna. At least one of the cellular module 22a, the WiFi module 22b, the BT module 22c, the GNSS module 22d, and the NFC module 22e may transmit/receive an RF signal through one or more separate RF modules. The SIM 22g may be an embedded SIM, and may also include intrinsic identification information (e.g., integrated circuit card identifier (ICCID)) or subscriber information (e.g., international mobile subscriber identity (IMSI)).

The memory 23 includes an internal memory 23a and an external memory 23b. The internal memory 23a may include a volatile memory (for example, a dynamic random access memory (DRAM), a static RAM (SRAM), a synchronous Dynamic RAM (SDRAM), etc.) and a non-volatile memory (e.g. a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g. a NAND flash memory or a NOR flash memory), a hard driver, or a solid state drive (SSD).

The external memory 23b may further include a flash drive (e.g., a compact flash (CF), a secure digital (SD), a micro secure digital (Micro-SD), a mini secure digital (Mini-SD), an extreme digital (xD), a multi-media Card (MMC), or a memory stick). The external memory 23b may be functionally or physically connected to the electronic device 20 through various interfaces.

The sensor module 24 may measure a physical quantity or may sense an operating status of the electronic device 20, and may convert the measured or sensed information into electric signals. The sensor module 24 includes a gesture sensor 24a, a gyro sensor 24b, an atmospheric pressure sensor 24c, a magnetic sensor 24d, an acceleration sensor 24e, a grip sensor 24f, a proximity sensor 24g, a color sensor 24h (e.g., red, green, blue (RGB) sensor), a biometric sensor 24i, a temperature/humidity sensor 24j, an illuminance sensor 24k, and an ultra-violet (UV) sensor 24l. Additionally or alternatively, the sensor module 24 may include an e-nose sensor, an electromyography (EMG) sensor, an electroencephalogram (EEG) sensor, an electrocardiogram (ECG) sensor, an infra-red (IR) sensor, an iris sensor, and/or a fingerprint sensor. The sensor module 24 may further include a control circuit for controlling one or more sensors incorporated therein. The electronic device 20 may further include a processor configured to control the sensor module 24 as a part of the processor 21 or separate from the processor 21 so as to control the sensor module 24 while the processor 21 is in the sleep state.

The input device 25 includes a touch panel 25a, a (digital) pen sensor 25b, a key 25c, and an ultrasonic input device 25d. The touch panel 25a can be a capacitive type touch panel, a resistive type touch panel, an infrared type touch panel, and an ultrasonic type panel. The touch panel 25a may include a control circuit and a tactile layer so as to provide a tactile reaction to a user.

The (digital) pen sensor 25b may be a portion of the touch panel, or may include a separate recognition sheet. The key 25c may include a physical button, an optical key, or a keypad. The ultrasonic input device 25d may sense, through a microphone 28d, ultrasonic waves that are generated by an input tool so as to confirm data corresponding to the sensed ultrasonic waves.

The display 26 includes a panel 26a, a hologram device 26b, a projector 26c, and a control circuit for controlling these components. The panel 26a may be implemented to be flexible, transparent, or wearable. The panel 26a may be constituted with the touch panel 25a and one or more modules. The panel 26a integrated with the touch panel 25a may include a pressure sensor (or a force sensor) that is capable of measuring the intensity of a pressure for a user's touch. The pressure sensor may be integrally implemented with the touch panel 25a, or implemented by one or more sensors separately from the touch panel 25a. The hologram device 26b may show a stereoscopic image in the air using interference of light. The projector 26c may project light onto a screen so as to display an image. The screen may be located inside or outside the electronic device 20. The interface 27 may include a high definition multimedia Interface (HDMI) 27a, a universal serial bus (USB) 27b, an optical interface 27c, or a d-subminiature (D-sub) 27d. The interface 27 may include a mobile high-definition link (MHL) interface, an SD card/multi-media card (MMC) interface, or an infrared data association (IrDA) standard interface.

The audio module 28 may bi-directionally convert sound and electric signals. The audio module 28 may process sound information input or output through a speaker 28a, a receiver 28b, an earphone 28c, or the microphone 28d.

The camera module 29a is a device that is capable of photographing a still image and a video image, and the camera module 29a may include at least one image sensor (e.g., a front sensor or a rear sensor), a lens, an image signal processor (ISP), or a flash (e.g., light emitting diode (LED) or xenon lamp).

The power management module 29d may manage the electric power of the electronic device 20. The power management module 29d may include a power management integrated circuit (PMIC), a charger integrated circuit (IC), or a battery gauge. The PMIC may be configured as a wired and/or wireless charge type. The wireless charging type may include a magnetic resonance type, a magnetic induction type, or an electromagnetic wave type, and may further include an additional circuit for wireless charging (e.g., a coil loop, a resonance circuit, or a rectifier). The battery gauge may measure the residual capacity of the battery 29e, and a voltage, a current, or a temperature during the charge. The battery 29e may include a rechargeable battery and/or a solar battery.

The indicator 29b may indicate a specific status of the electronic device 20 or of a part thereof (e.g., the processor 21), such as a booting status, a message status, or a charged status.

The motor 29c may convert an electric signal into a mechanical vibration, and may generate a vibration or a haptic effect. The electronic device 20 may include a mobile TV support device (e.g., a GPU) that is capable of processing media data according to standards, such as digital multimedia broadcasting (DMB), digital video broadcasting (DVB), or MediaFlo™.

Each of the components described herein may be constituted with one or more components, and the names of the corresponding components may vary depending on a type of the electronic device 20. The electronic device 20 may not include some of the components, or may include an additional component. Alternatively, some of the components may be combined with each other to be configured as one object, and to perform the functions, which are the same as those of the corresponding components prior to the combination.

The electronic device 20 (and/or components thereof) can be incorporated into any of the electronic devices described hereinafter.

Figure 2:
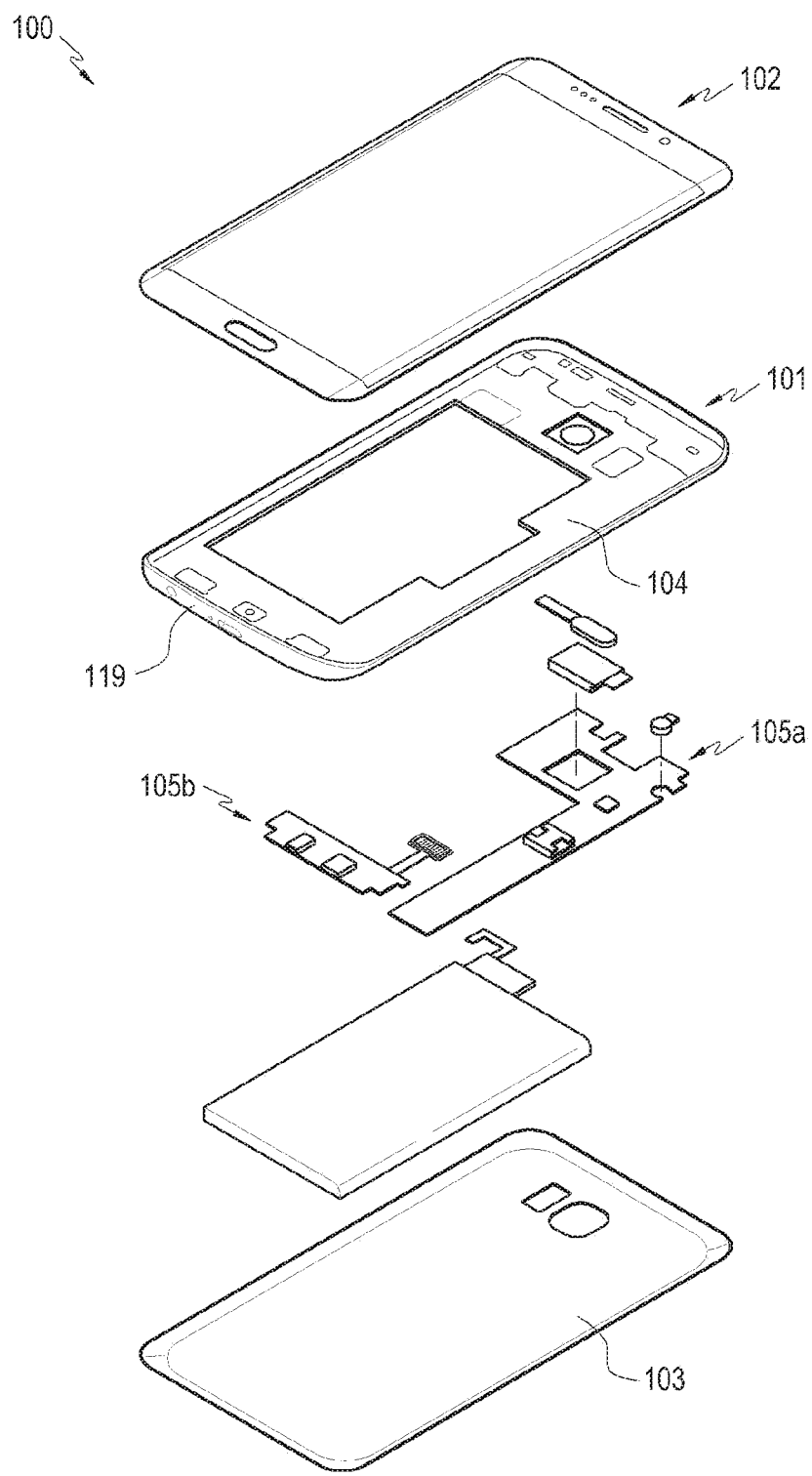
FIG. 2 is an exploded, perspective view of the electronic device, according to an embodiment of the present disclosure.
Figure 3:
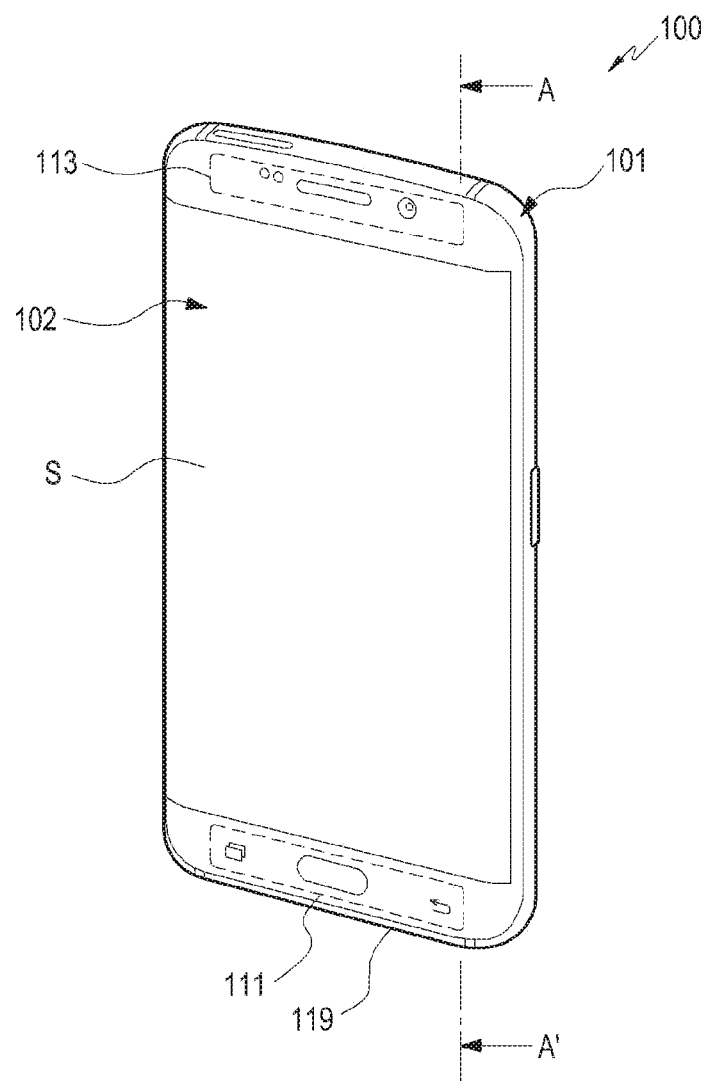
FIG. 3 is a perspective view of an electronic device, according to an embodiment of the present disclosure.
Figure 4:
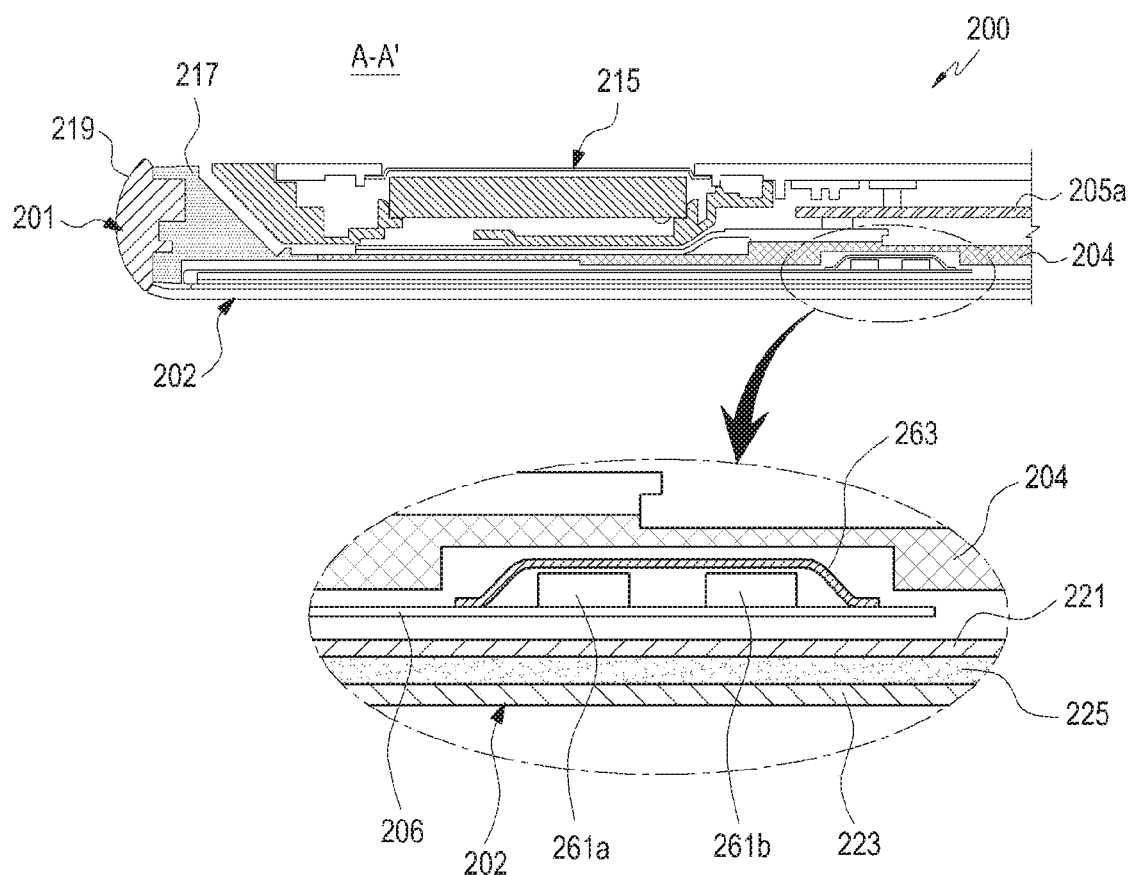
FIG. 4 is a partial, cut-away cross-sectional view of the electronic device, according to an embodiment of the present disclosure.

FIG. 2 is an exploded, perspective view of an electronic device 100, according to an embodiment of the present disclosure in a disassembled state. FIG. 3 is a perspective view of the electronic device 100, according to an embodiment of the present disclosure. FIG. 4 is a partial cut-away cross-sectional view illustrating an electronic device 200, according to an embodiment of the present disclosure. For example, FIG. 4 is a cross-sectional view of the electronic device 100 taken along line A-A' of FIG. 3. The components of the electronic device 100 of FIGS. 2 and 3 can be used with the components of the electronic device 200 of FIG. 4 (or FIG. 1).

Referring to FIGS. 2 and 3, the electronic device 100 includes a shielding member 263 (FIG. 4) attached to a main circuit board 105a or an auxiliary circuit board 105b (or a flexible printed circuit board 206 of FIG. 4). The electronic device 100 may be a mobile communication terminal, and may include a housing 101, a display device 102, and a rear cover 103. The support member 104 may be integrally formed with the housing 101 and may have a substantially plate-like shape, which is disposed to face the display device 102. A portion of the support member 104 (e.g., at least a portion of an edge) may be curved, and the display device 102 may include a curved face portion corresponding to the support member 104.

In the following detailed description, terms circuit board and flexible printed circuit board may be separately described as necessary, and the circuit board may be used to mean both a rigid circuit board or flexible printed circuit board.

The housing 101 forms the body of the electronic device 100 and is able to house at least one of the circuit boards 105a and 105b. The support member 104 may be housed in the housing 101 (or formed integrally with the housing 101) to complement and improve the rigidity of the electronic device 100, and may separate some electronic component installation spaces from each other. For example, when the electronic device 100 includes the display device 102, the support member 104 may separate the installation space of a display panel 221 and the space in which IC chips, such as the processor 21 in FIG. 1, are installed, to prevent the electronic components from interfering with the display panel 221. The support member 104 may be partially disposed between the display device 102 and an electronic component (e.g., a speaker 215 of FIG. 4).

At least a portion of the housing 101 may be made of a conductive material, and at least a portion of the conductive material of the housing 101 may form an antenna device (e.g., a radiating conductor 119). The radiating conductor 119 forms a portion of the side wall of the housing 101 and is insulated from other portions of the housing 101. Further, the radiating conductor 119 may be connected to a communication module (e.g., the communication module 22 of FIG. 1) so that the radiating conductor 119 may form an antenna device.

The display device 102 may be mounted on the front face of the housing 101 to form an appearance of the electronic device 100 together with at least a portion of the housing 101, and may include a window member 223 (FIG. 4) in which the display panel 221 can be integrated. The display device 102 may include a touch panel (e.g., the touch panel 25a of FIG. 1 or a touch panel 225 (FIG. 4) integrated into the display panel 221 or the window member 223. The display device 102 may a device for outputting a screen in the electronic device 100, and may be utilized as an input device configured to receive a user's touch input.

The display device 102 may provide a region S (FIG. 3) for outputting a screen on the front face of the housing 101, and in the lower side 111 and the upper side 113 of the region S, various input/output devices, sensors, or the like may be disposed. Input devices, such as a touch key and a button (e.g., the key 25c of FIG. 1), may be provided in the lower side 111 of the region S, and a reception module (e.g., the receiver 28b of FIG. 1), a proximity sensor (e.g., the proximity sensor 24g of FIG. 1), an illuminance sensor (e.g., the illuminance sensor 24k of FIG. 1), and the like may be disposed in the upper side 113. A camera module (e.g., the camera module 29b of FIG. 1) may be disposed on the upper side 113 of the region S in order to provide a function, such as a video call. The input device disposed in the lower side 111 may be configured with a touch screen. A display panel display panel 221 (FIG. 4) of the display device 102 may extend to the region of the lower side 111, and may be combined with a touch panel (e.g., the touch panel 25a of FIG. 1), thereby replacing the input device in the lower side 111.

One of the circuit boards 105a and 105b may be connected to the display device 102 including the display panel 221 and/or the touch panel 225 of FIG. 4. In connecting one of the circuit boards 105a and 105b to the display device 102, electronic components such as IC chips 261a and 261b (FIG. 4) for driving the display panel 221 and/or the touch panel 225 may be mounted on the flexible printed circuit board 206 (FIG. 4, and the shielding member 263 (FIG. 4) may be attached to the flexible printed circuit board 206 with electronic components being interposed between the shielding member 263 and the flexible printed circuit board 206.

The flexible printed circuit board 206 may be bonded to the display panel 221 (and/or the touch panel 225). A portion of the flexible printed circuit board 206 may be disposed on a face different from the display panel 221 on the support member 104 by being bent to bypass the support member 104. For example, a portion of the support member 104 may be positioned between the flexible printed circuit board 206 and the display panel 221.

The rear cover 103 may be mounted on the rear face of the housing 101 and may form the appearance of the electronic device 100, together with at least a portion of the housing 101 and/or at least a portion of the display device 102. The rear cover 103 may be detachably mounted to the housing 101, and the user may remove various storage media (e.g., a card on which the SIM 22g is mounted and the external memory 23b of FIG. 1), or replace a battery (e.g., the battery 29e of FIG. 1) in the state where the rear cover 103 is separated. The rear cover 103 may formed as a uni-body with the housing 101 so that the user cannot arbitrarily replace a battery or the like.

The main circuit board 105a or the auxiliary circuit board 105b may be provided within the housing 101, and the number of circuit boards may be suitably set according to the design of the inner space of the electronic device 100. Various IC chips that are equipped with a processor (e.g., the processor 21 of FIG. 1) or an audio module (e.g., the audio module 28 of FIG. 1), a communication module (e.g., the communication module 22 of FIG. 1) may be mounted on the main circuit board 105a or the auxiliary circuit board 105b, and another shielding member may be attached to the main circuit board 105a or the auxiliary circuit board 105b with the IC chip being interposed between the shielding member and the circuit board.

Referring to FIG. 4, the electronic device 200 may include a speaker 215 for outputting sound disposed adjacent to a side wall (e.g., the radiating conductor 219) of a housing 201. The radiating conductor 219 may be wrapped in an insulating material portion 217 and insulated from the housing 201 and/or electronic components of the electronic device 200. The insulating material portion 217 may provide an electromagnetic shielding function between the radiating conductor 219 and other peripheral electronic components of the electronic device 200. The speaker 215 can be controlled independently from the above-described reception module. For illustrative purposes, the electronic components are described herein in conjunction with using the speaker 215, but the present disclosure is not so limited. For example, other electronic components such as, a microphone (e.g., the microphone 28d of FIG. 1) and a vibration module (e.g., the motor 29c of FIG. 1) may also be disposed adjacent to the radiating conductor 219.

The display device 202 of the electronic device 200 includes the display panel 221, the window member 223, and the touch panel 225. The display panel 221 has a light emitting layer disposed between glass substrates that face each other, and may receive a control signal through the flexible printed circuit board 206. The control signal may be provided through the flexible printed circuit board 206 in order to output a screen.

The touch panel 225 may be disposed between the display panel 221 and the window member 223 while facing the window member 223. The touch panel 225 may be configured such that a touch input (e.g., click, hovering, or drag) of the user can be detected by a combination of leads formed on a transparent substrate (e.g., a polyimide film). The touch panel 225 may incorporate a pressure sensor in order to detect the contact pressure of the user.

The window member 223 forms the appearance of the electronic device 200 together with the housing 201, and protects the display panel 221 and/or the touch panel 225 from an external environment. The window member 223 may provide a screen output region (e.g., the region S of FIG. 3) corresponding to the display panel 221.

The support member 204 of the electronic device 200 is housed in the housing 201 (or integrally formed as a portion of the housing 201), and may be disposed between the display panel 221 and a main circuit board 205a. For example, the support member 204 prevents an IC chip disposed on the main circuit board 205a from interfering with the display panel 221. The support member 204 may be at least partially made of a conductive material in order to provide an electromagnetic shielding function.

In mounting the display device 202 to the housing 201, a portion of the window member 223 may be bonded to the housing 201 (and/or the support member 204). In mounting the display device 202 to the housing 201, a portion of the window member 223 (e.g., the lower side 111 and/or the upper side 113 of FIG. 3) may be bonded to the housing 201 (and/or the support member 204) in the lower end and/or the upper end of the housing 201, and a portion of the display panel 221 may be bonded to the housing 201 (and/or the support member 204) in the opposite side ends of the housing 201.

The flexible printed circuit board 206 may extend from the display device 202, and a portion thereof may be disposed to bypass the support member 204. The flexible printed circuit board 206 may extend from the display device 202, and a portion of the flexible printed circuit board 206 may be disposed to face the display device 202 with the support member 204 being interposed therebetween. The arrangement of the flexible printed circuit board 206 as described above will be described in more detail with reference to FIGS. 5 to 7.

Figure 5:
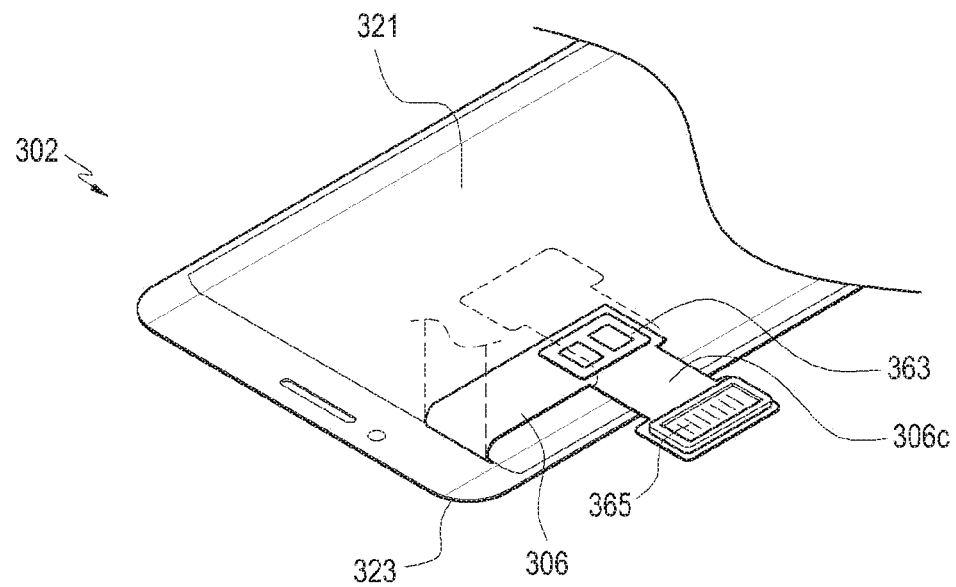
FIG. 5 is a perspective view of a display device of an electronic device, according to an embodiment of the present disclosure.
Figure 6:
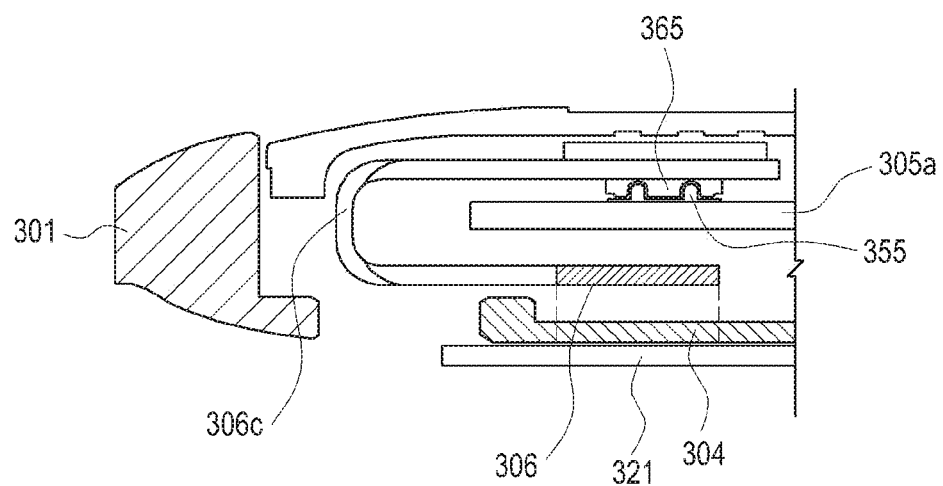
FIG. 6 is a cross-sectional view of the display device o connected to a circuit board, according to an embodiment of the present disclosure.

The flexible printed circuit board 206 is provided to transmit control signals of the display panel 221 and/or the touch panel 225, and may be connected to the main circuit board 205a through a connector (e.g., a connector 365 in FIG. 5 or 6). Another connector (e.g., a connector 355 of FIG. 6) corresponding to the connector 365 may be disposed on the main circuit board 205a. One or more IC chips 261a and 261b may be mounted on the flexible printed circuit board 206. The IC chips 261a and 261b may include at least one of a driving chip 261a for the display panel 221 and a driving chip 261b for the touch panel 225. The IC for driving the display panel 221 and the IC for driving the touch panel 225 may be integrated into a single IC chip.

The electronic device 200 includes the shielding member 263 that is coupled or bonded to the flexible printed circuit board 206 surrounding the IC chips 261a and 261b. The shielding member 263 is a film-type shielding member, and may provide an electromagnetic shielding function. For example, the shielding member 263 may provide a stable operating environment for the IC chips 261a and 261b by isolating the IC chips 261a and 261b from external electromagnetic waves. The shielding member 263 prevents the electromagnetic waves, which are generated by the operation of the IC chips 261a and 261b, from interfering with other peripheral electronic components (e.g., the radiating conductor 219 serving as an antenna or the speaker 215).

The flexible printed circuit board 206 may be provided with a ground layer, and the shielding member 263 may be electrically connected to the ground layer of the flexible printed circuit board 206. The ground layer of the flexible printed circuit board 206 may provide an electromagnetic shielding function while providing ground to the IC chips 261a and 261b. For example, the IC chips 261a and 261b may be stably operated without being affected by the surrounding electromagnetic field by being surrounded by the ground layer of the flexible printed circuit board 206 and the shielding member 263.

The shielding member 263 may be miniaturized by forming the shielding member 263 in a film-type. For example, with a film-type shielding member 263, the IC chips 261a and 261b may be provided with a stable operation function even though the IC chips 261a and 261b are disposed adjacent to electronic components, such as the radiating conductor 219 forming an electromagnetic field therearound. Also with the film-type shielding member 263, the IC chips 261a and 261b may be easily installed in a stacked structure to accommodate an electronic component having a predetermined or larger size, such as the speaker 215. For example, since the flexible printed circuit board 206 and/or the IC chips 261a, 261b may be disposed to at least partially face the speaker 215, the shielding member 263 may be disposed between the IC chips 261a and 261b and the speaker 215, thereby providing a stable operating environment for each of the IC chips 261a and 261b and the speaker 215.

FIG. 5 is a perspective view of an inner face of a display device 302 of the electronic device (one of the previously described electronic devices 20, 100, 200), according to an embodiment of the present disclosure.

A display panel 321 can be coupled to the inner face of a window member 323, and a flexible printed circuit board 306 may extend from one side of the display panel 321. On one face of the flexible printed circuit board 306, a shielding member 363 may be attached to the flexible printed circuit board 306 and may surround IC chips (e.g., the IC chips 261a and 261b in FIG. 4). The shielding member 363 may be in the form of a film, and may form a stable shielding structure while suppressing a thickness increase due to the formation of the shielding structure.

A portion of the flexible printed circuit board 306 (e.g., a connection section 306c) may extend outwardly of the display panel 321 and/or the window member 323. The connection section 306c may be bent to bypass a support member (e.g., the support member 204 of FIG. 4) and may be connected to the main circuit board (e.g., the main circuit board 205a of FIG. 4).

FIG. 6 is a cross-sectional view of the display device 302 that is connected to a circuit board 305a, according to an embodiment of the present disclosure.

A connection section 306c of a flexible printed circuit board 306 (FIG. 5), which extends from the display panel 321, may be bent to bypass the support member 304 and/or the circuit board 305a. A portion of the connection section 306c may be disposed to face the display panel 321, with the support member 304 and/or the circuit board 305a being interposed therebetween.

A connector 365 can be provided at the end of the connection section 306c to be connected to another connector 355 disposed on one face of the circuit board 305a. The display panel 321 may be connected to the circuit board 305a via the flexible printed circuit board 306 and the connector 365 provided on the flexible printed circuit board 306. A portion of the connection section 306c may be disposed between the circuit board 305a and the support member 304.

Figure 7:
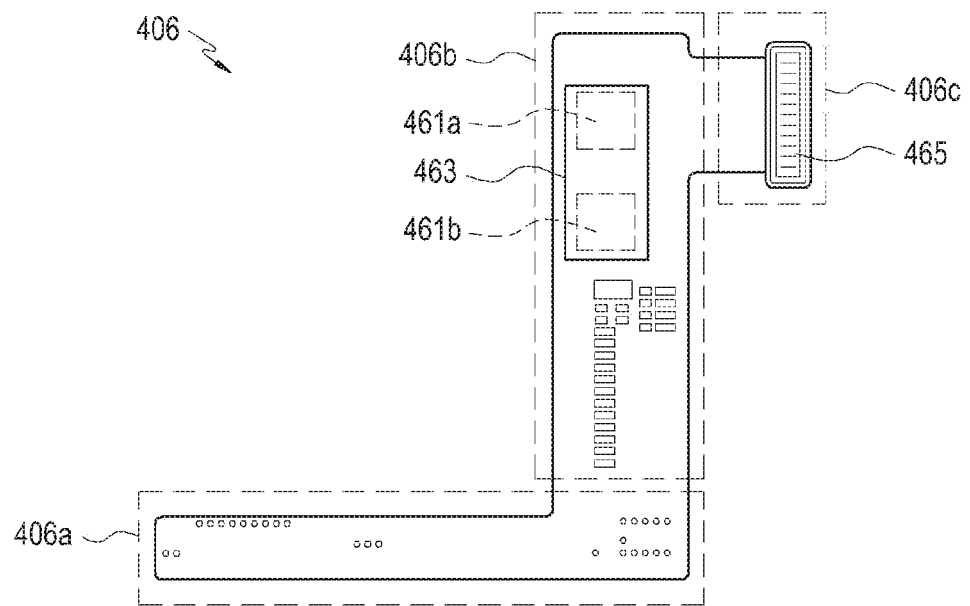
FIG. 7 is a plan view of a shielding member of an electronic device, according to an embodiment of the present disclosure.

FIG. 7 is a plan view of the shielding member 463 of an electronic device, according to an embodiment of the present disclosure.

Referring to FIG. 7, the shielding member 463 may be attached to the flexible printed circuit board 406 and surrounds the IC chips 461a and 461b. The flexible printed circuit board 406 may include a bonding section 406a, a device section 406b, and a connection section 406c.

The bonding section 406a may include an anisotropic conductive film (ACF) so that the bonding section 406a can be mechanically or electrically coupled to the display panel 221 and/or the touch panel 225 of FIG. 4. For example, the bonding section 406a may be provided as a region for bonding the flexible printed circuit board 406 to the display panel 221 and/or the touch panel 225.

The device section 406b is a region extending from the bonding section 406a, and the device section 406b can be used for positioning the IC chips 461a and 461b thereon, and electrode pads corresponding to the IC chips 461a and 461b and a printed circuit pattern connected to the electrode pads may be provided in the device section 406b. The IC chips 461a and 461b may be connected to the display panel 221 and/or the touch panel 225 as well as the main circuit board 205a of FIG. 4 via the electrode pads or the printed circuit pattern. Each of the IC chips 461a and 461b may include a chip for driving the display panel 221 and/or the touch panel 225.

The shielding member 463 may be an electromagnetic shielding member, and may be attached to the device section 406b for surrounding the IC chips 461a and 461b. The shielding member 463 may be a film-type, and thus, when the shielding member 463 is attached to the flexible printed circuit board 406 (e.g., the device section 406b), a flexure may be formed on the outer face thereof. For example, when the shielding member 463 is coupled to surround a plurality of IC chips 461a and 461b, a recessed portion having a predetermined depth or shape may be formed on the outer face of the shielding member 463 in a region between the IC chips.

The connection section 406c extends from the device section 406b and may connect the IC chips 461a and 461b to the main circuit board 205a of FIG. 4 of the electronic device. For example, the connector portion 406c may be provided with the connector 465 connected to the main circuit board 205a of the electronic device.

Figure 8:
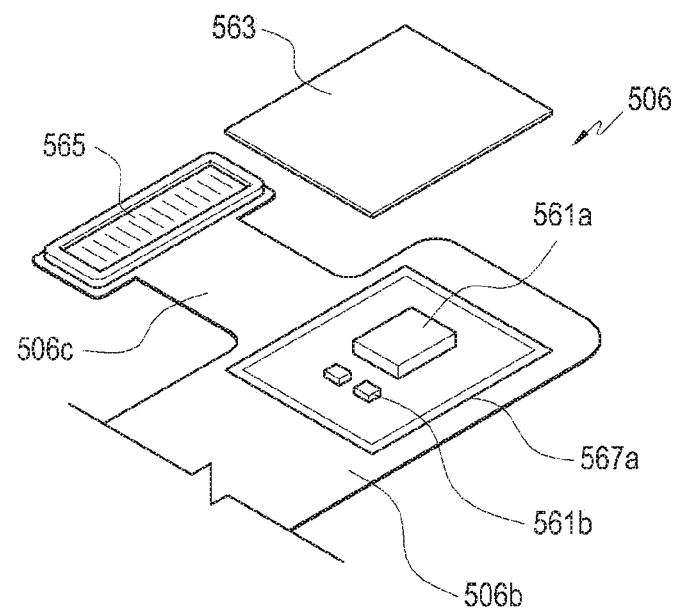
FIGS. 8 and 9 are exploded, perspective views of the shielding member, according to an embodiment of the present disclosure.
Figure 9:
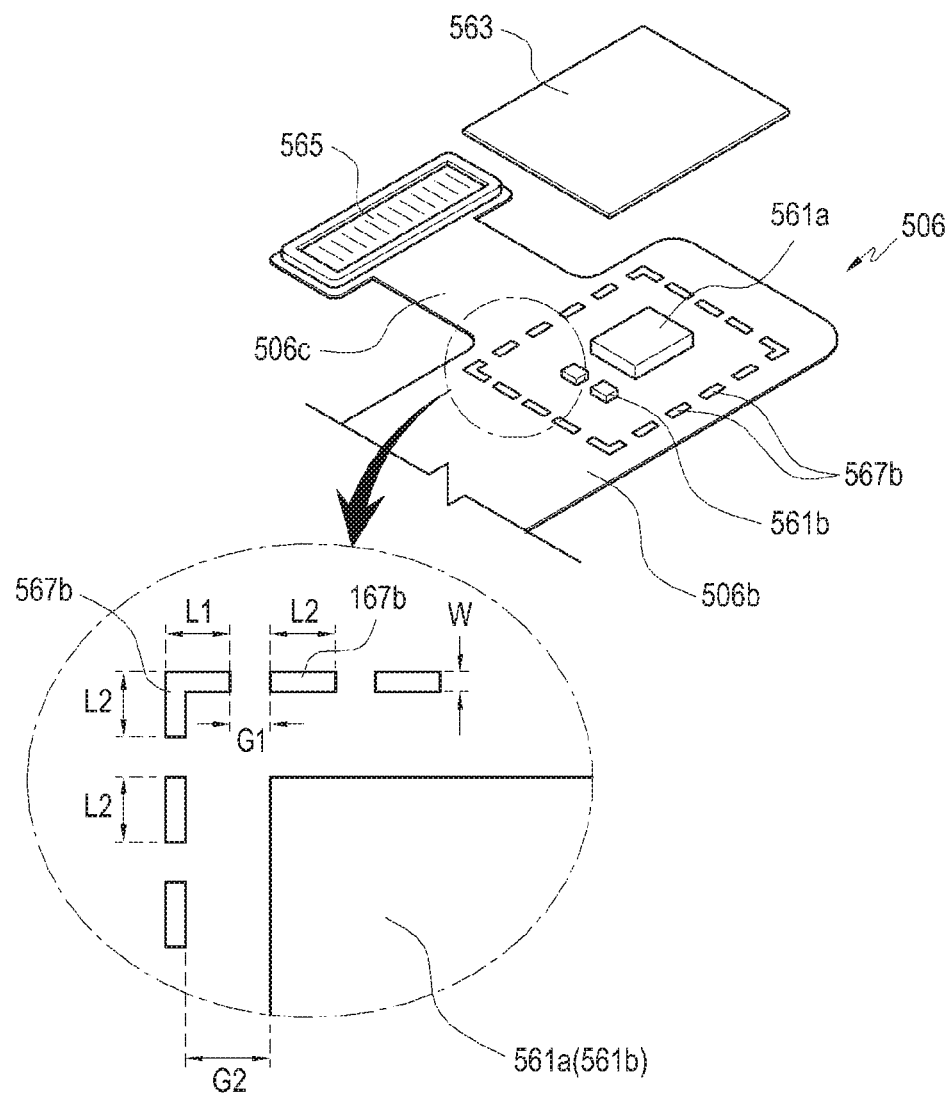

FIGS. 8 and 9 are exploded, perspective views of the shielding member 563 of the electronic device, according to an embodiment of the present disclosure.

The shielding member 563 is a film-type shielding member that is directly attached to a device section 506b of a flexible printed circuit board 506. The device section 506b may include one or more IC chips 561a and 561b and one or more ground pads 567a and 567b formed around the IC chips 561a and 561b. The ground pads 567a and 567b are exposed on one side of a flexible printed circuit board 506 (e.g., the device section 506b), and may be formed or arranged to surround a region in which the IC chips 561a and 561b are disposed. The flexible printed circuit board 506 may be connected to a display panel (e.g., the display panel 221 of FIG. 4) and/or a touch panel (e.g., the touch panel 225 of FIG. 4).

The flexible printed circuit board 506 may be a multi-layer circuit board, which may include at least one ground layer, and the ground pads 567a and 567b may be connected to the ground layer through via holes or the like.

The ground pad 567a may have a closed curve shape surrounding a region in which the IC chips 561a and 561b are disposed. The ground pad 567a may be formed in a curve shape with an open portion, rather than in a complete closed curve shape.

The plurality of ground pads 567b may be arranged along a closed curve trace surrounding the region in which the IC chips 561a and 561b are disposed. The ground pads 567a and 567b may have a width W of 0.5 mm or more. When the plurality of ground pads 567b are arranged as illustrated in FIG. 9, the plurality of ground pads 567b can have lengths L1 and L2, which are 2 mm or more, and may be spaced apart at an interval G1 of about 1 mm or less. The plurality of ground pads 567b are arranged in a polygonal form, and each of the horizontal and vertical lengths L1 and L2 may extend to a length of 2 mm or more at the portions where the vertices of the polygon are formed.

In accordance with the present disclosure, and of the aforementioned shielding members may be bonded to any of the aforementioned ground pads so that the shield member may be electrically connected to a ground layer. For example, the shielding member 563 can be used to isolate a space in which the IC chips 561a and 561b are disposed spatially and/or electrically, and the shape and arrangement of the plurality of ground pads 567a and 567b may be appropriately selected in consideration of the shielding performance required for a particular electronic device, a manufacturing cost, a manufacturing process, and the like.

Figure 10:
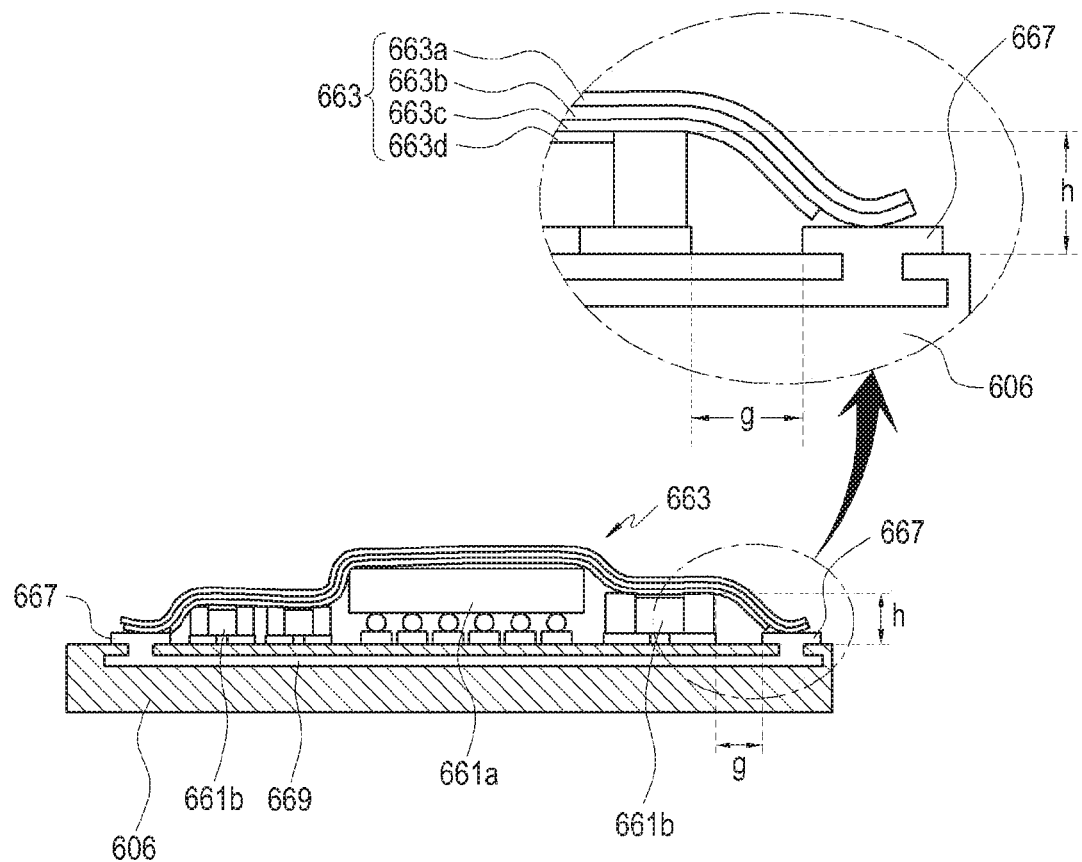
FIG. 10 is a cross-sectional view of the shielding member, according to an embodiment of the present disclosure.

FIG. 10 is a cross-sectional of a shielding member 663 of an electronic device, according to an embodiment of the present disclosure.

An electronic device (e.g., electronic device 200 of FIG. 4) may include a circuit board 606 (e.g., the flexible printed circuit boards 306 or 406 in FIGS. 5 to 7) including at least one ground layer 669, and a shielding member 663 attached to one face of the flexible printed circuit board 606. Various IC chips 661a and 661b may be mounted on the flexible printed circuit board 606 and the shielding member 663 may be attached to the flexible printed circuit board 606 with at least one of the IC chips 661a and 661b being interposed between the shielding member 663 and the flexible printed circuit board 606. The flexible printed circuit board 606 may include electrode pads for connecting the ground pads 667 and/or the IC chips 661a and 661b, which are connected to the ground layer 669, to the printed circuit pattern of the flexible printed circuit board 606. For example, the IC chips 661a and 661b may be mounted on the flexible printed circuit board 606 through a surface mounting process.

The ground pads 667 may be exposed on one surface of the flexible printed circuit board 606. Each ground pad 667 may be in the form of a closed curve surrounding the region in which the IC chips 661a and 661b are disposed, or a plurality of ground pads 667 may be arranged along the closed curve trace. The ground pads 667 are connected to the ground layer 669 through via holes or the like formed in the flexible printed circuit board 606. When the shielding member 663 is attached, a shielding layer 663b may be electrically connected to the ground layer 669.

The shielding member 663 may be a film-type shielding member including an insulating film 663a, a shielding layer 663b, and a resin adhesive layer 663c. When the shielding member 663 is attached to the circuit board 606, the shielding member 663 may be flexibly deformed in correspondence to the height of the IC chips 661a and 661b.

The insulating film 663a may be in the form of a film having a thickness of about 5 to 8 micrometers (μm). The shielding layer 663b may be formed on one face of the insulating film 663a and may be formed of a layer of an electrically conductive material having a thickness of about 2 to 10 micrometers. For example, the shielding layer 663b may be formed of a copper foil having a predetermined thickness or a vapor deposition layer in which a conductive material, such as copper (Cu), gold (Au), or silver (Ag) is deposited. The shielding layer 663b may be a combination of a copper foil and a deposition layer.

The resin adhesive layer 663c may include a resin adhesive (e.g., a thermoplastic resin adhesive) to which electrically conductive powder is added. When the resin adhesive layer 663c is heated to a predetermined or higher temperature, it is denatured into an adhesive having a suitable viscosity. When the resin adhesive layer 663c is cooled again, the resin adhesive layer 663c is cured in a predetermined form to function as an adhesive layer. When the shielding member 663 is heated and cooled while being pressurized in the state of being placed on the flexible printed circuit board 606, the resin adhesive layer 663c is denatured and then cured so that the shielding member 663 can be fixedly attached to the flexible printed circuit board 606. The shielding member 663 may be attached to the ground pad 667 as the edge portion of the shielding member 663, e.g., the edge portion of the resin adhesive layer 663c is denatured and then cured. The thermoplastic resin adhesive described above may include an epoxy resin or a polyester resin.

The resin adhesive layer 663c may include conductive powder so that the resin adhesive layer 663c is able to electrically connect the shielding member 663, e.g., the shielding layer 663b, to the ground pad 667 and/or the ground layer 669. The IC chips 661a or 661b may be located in a space surrounded by the ground layer 669 and the shielding member 663 and may be spatially isolated from other spaces, and may also be electrically isolated from other spaces by the grounding layer 669 and/or the shielding member 663.

The shielding member 663 is a film-type shielding member and is directly attached to the flexible printed circuit board 606 so that the inner face of the shielding member 663 is able to come into direct contact with the top surfaces of the IC chips 661a and 661b. A surface of the IC chips 661a or 661b may come into direct contact with the resin adhesive layer 663c (and/or the shielding layer 663b). In order to prevent the IC chips 661a or 661b and the resin adhesive layer 663c (and/or the shielding layer 663b) from being electrically short-circuited, the shielding member 663 may further include an insulating layer 663d. The insulating layer 663d may prevent the resin adhesive layer 663c (and/or the shielding layer 663b) from coming into direct contact with the IC chips 661a or 661b.

The insulating layer 663d may be formed on one face of the resin adhesive layer 663c at least in a region corresponding to the IC chips 661a or 661b. Since the resin adhesive layer 663c is bonded to the ground pad 667 at least at the edge portion thereof, the insulating layer 663d may be formed in a smaller area than that of the resin adhesive layer 663c. The insulating layer 663d may be formed to have a larger area than the area corresponding to the IC chips 661a or 661b and to have a smaller area than the resin adhesive layer 663c. When the shielding member 663 is bonded to the circuit board 606, the insulating layer 663d may be disposed to face or to come into contact with the IC chips 661a or 661b.

In accordance with the present disclosure, any of the aforementioned shielding members may be of a film-type having a size approximately corresponding to the area in which the IC chips are disposed, and the edge portion thereof may be attached to the ground pad around the region in which the IC chips are disposed. Therefore, since the resin adhesive layer of the shielding members is intended to provide electrical connection while bonding the shielding layer to the ground pad, the resin adhesive layer may be formed only at the edge of the shielding members. For example, the insulating layer 663d of FIG. 10 may be formed on the inner face of the shielding layer 663b in an area smaller than the shielding layer 663b, and the resin adhesive layer 663c may be formed in a closed curve shape surrounding the insulating layer 663d while being formed on one face of the shielding layer 663b at the edge portion.

The shielding member 663 may be attached to the flexible printed circuit board 606 in a flexibly deformed state so as to correspond to a flexure formed due to a height difference between the IC chips 661a and 661b. When the shielding member 663 is attached to the flexible printed circuit board 606, the resin adhesive layer 663c maintains a constant thickness even after a considerable time passes. However, since the shielding member 663 deformed in a curved shape has a tendency to be restored into a planar shape, the bonding strength of the resin adhesive layer 663c may be weakened. The greater the change in the inclination of the curvature of the shielding member 663, the greater the influence on the bonding strength of the resin adhesive layer 663c.

When the shielding member 663 is attached to the flexible printed circuit board 606 in a flexibly (curvedly) deformed state, the boding strength of the resin adhesive layer 663c can be stably maintained by making the curve of the shielding member 663 gentle at least in a region adjacent to the ground pad 667. For example, the curve of the shielding member 663 can be maintained in the resin adhesive layer 663c and a region adjacent to the resin adhesive layer 663c by maintaining the ground pad 667 at a predetermined interval indicated by reference numeral "G2" of FIG. 9 from the nearest IC chip (e.g., the IC chip 661b).

A gap g between the ground pad 667 and the IC chip 661 adjacent to the ground pad 667 is secured to be equal to and greater than a half of the height h of the IC chip 661b adjacent to the ground pad 667 (g>=0.5 h) from one face of the flexible printed circuit board 606, so that the stable bonding strength of the resin adhesive layer 663c can be maintained. A gap g between the ground pad 667 and the IC chip 661b adjacent thereto may be appropriately set in consideration of the bonding strength of the resin adhesive layer 663c and the utilization efficiency of the surface area of the circuit board 606.

Generally, a shield can made of a thin metal plate may be utilized for electromagnetic shielding of an IC chip or on a circuit board. In a shielding structure using a shield-can, the space inside the shield-can may be molded with a resin so as to insulate the shield-can from the IC chip. The shielding structure utilizing such a shield-can has a height of about 0.35 mm from the top face of the IC chip. The electromagnetic shielding member in the form of a film-type as disclosed herein may be attached directly to the top face of the IC chip. Such a shielding structure may be formed within a height of about 0.03 mm from the top face of the IC chip.

Figure 11:
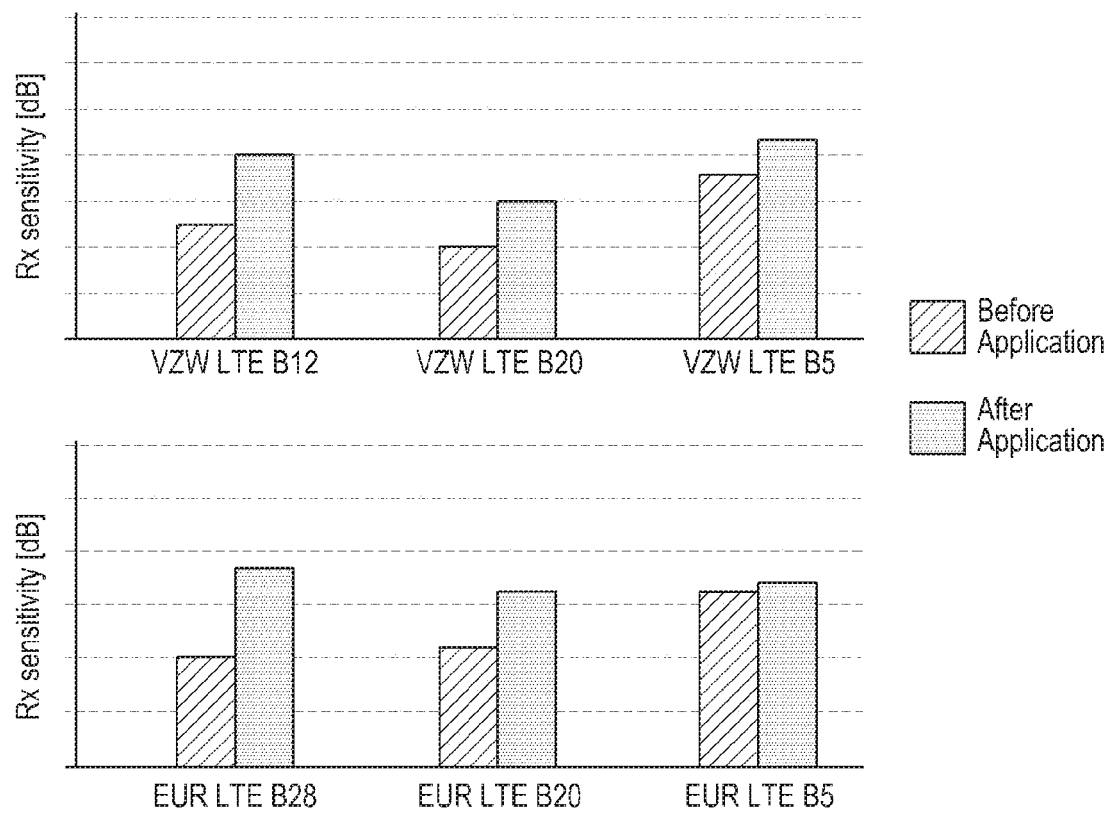
FIG. 11 is a diagram illustrating graphs representing reception (Rx) sensitivities of antenna devices, which were measured before and after applying thereto a shielding member of the electronic device, according to an embodiment of the present disclosure.

FIG. 11 is a diagram illustrating graphs representing reception (Rx) sensitivities of antenna devices, which were measured before and after applying thereto a shielding member of the electronic device, according to an embodiment of the present disclosure.

Measurement specimens (e.g., the electronic device 200 of FIG. 4), each of which is equipped with one of antenna devices which correspond to US (VZW) commercial frequency bands or one of antenna devices which correspond to European (EUR) commercial frequency bands were manufactured. FIG. 11 illustrates graphs representing results obtained by measuring the reception sensitivities of antenna devices before and after applying one of the aforementioned shielding members to each of measurement specimens. The measurement results of FIG. 11 were obtained through a measurement in the state in which the display panels are activated (e.g., in the state in which IC chips 261a and 261b for drive the display panel 221 and/or the touch panel 225 of FIG. 4 operate).

Referring to FIG. 11, the reception sensitivities of the antenna devices are improved by a maximum of about 3.5 dB when the aforementioned shielding members are applied thereto, as compared with the antenna devices before the aforementioned shielding member are applied.

Generally, electronic components such as a speaker may have a predetermined size (e.g., a volume) in order to secure good sound quality and volume. Considering the trend toward the miniaturization and thinning of electronic devices, electronic components having a predetermined size may have a limitation in stacking thereof with other circuit boards, IC chips, etc. A shielding member in accordance with the present disclosure enables IC chips to be placed in a smaller space while providing a stable shielding performance (e.g., alleviating or preventing the effects on the operating environment of the antenna device). In addition, it is easy to stack the shielding members described herein to be close to other electronic components (e.g., an electronic component having a predetermined size, such as a speaker) so that the degree of freedom in designing the arrangement of the electronic components and circuit boards can be improved.

An electronic device, according to various embodiments of the present disclosure, may include: a housing including at least one radiating conductor forming a portion of a side wall; an electronic component disposed adjacent to the radiating conductor; a circuit board including at least one integrated circuit chip and disposed to at least partially face the electronic component; and a film-type electromagnetic shielding member attached to the circuit board.

The shielding member may be coupled to surround the integrated circuit chip.

The shielding member may include: an insulating film; an electromagnetic shielding layer attached to one face of the insulating film; and a resin adhesive layer formed on one face of the electromagnetic shielding layer.

The resin adhesive layer may include a resin adhesive to which electrically conductive powder is added.

The electromagnetic shielding layer may include a foil or a vapor deposition layer to which copper (Cu) or silver (Ag) is added.

The resin adhesive layer may include an epoxy resin or a polyester resin.

The circuit board may include at least one ground pad exposed around the integrated circuit chip, and a portion of the resin adhesive layer may be bonded to the ground pad.

There is provided a plurality of ground pads, which may be arranged along a periphery of a region in which the integrated circuit chip is mounted.

The ground pad may be formed in a curve or closed curve shape that surrounds a periphery of a region in which the integrated circuit chip is mounted.

The shielding member may further include an insulating layer formed on the resin adhesive layer and facing the integrated circuit chip.

The electronic device may further include a display device disposed on the front face of the housing, and the circuit board may include a flexible printed circuit board connected to the display device.

The display device may include: a window member; a touch panel disposed to face the window member; and a display panel disposed to face the window member with the touch panel being interposed therebetween.

The integrated circuit chip may include at least one of a driving chip for the touch panel and a driving chip for the display panel.

The touch panel may include at least one of an electrostatic touch panel and a pressure sensitive touch panel.

The electronic device may further include a support member at least partially interposed between the electronic component and the display device.

The support member may be disposed between the circuit board and the display device.

The circuit board may be connected to the display device to bypass the support member.

The integrated circuit chip may be disposed to face the electronic component with the shielding member being at least partially interposed therebetween.

The shielding member may include: an insulating film; an electromagnetic shielding layer attached to one face of the insulating film; and a resin adhesive layer formed on one face of the electromagnetic shielding layer.

The resin adhesive layer may include a resin adhesive to which electrically conductive powder is added.

The shielding member may further include an insulating layer formed on the resin adhesive layer and facing the integrated circuit chip.

The resin adhesive layer may include a thermosetting resin adhesive.

The electronic device may include a speaker.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. An electronic device comprising:
a housing including a radiating conductor forming a portion of a side wall thereof;
an electronic component disposed adjacent to the radiating conductor;
a circuit board including an integrated circuit (IC) chip and at least one ground pad exposed along a periphery of a region in which the IC chip is mounted; and
a shielding member attached to the at least one ground pad of the circuit board and surrounding the IC chip,
wherein the at least one ground pad and the IC chip adjacent to the at least one ground pad are configured to form a gap therebetween such that the gap is secured to be greater than or equal to half of a height of the IC chip adjacent to the at least one ground pad from one face of the circuit board.

2. The electronic device of claim 1, wherein the shielding member includes:
an insulating film;
an electromagnetic shielding layer attached to the insulating film; and
a resin adhesive layer formed on the electromagnetic shielding layer and including a resin adhesive to which electrically conductive powder is added.

3. The electronic device of claim 2, wherein the electromagnetic shielding layer includes one of a foil and a vapor deposition layer to which one of copper and silver is added.

4. The electronic device of claim 2, wherein the resin adhesive layer includes one of an epoxy resin and a polyester resin.

5. The electronic device of claim 2, wherein a portion of the resin adhesive layer is bonded to the at least one ground pad.

6. The electronic device of claim 5, wherein a plurality of ground pads are arranged along the periphery of the region in which the IC chip is mounted.

7. The electronic device of claim 5, wherein the at least one ground pad is formed in one of a curve and closed curve shape that surrounds the periphery of the region in which the IC chip is mounted.

8. The electronic device of claim 2, wherein the shielding member further includes an insulating layer formed on the resin adhesive layer and facing the IC chip.

9. The electronic device of claim 1, further comprising a display device mounted on the housing, wherein the circuit board includes a flexible printed circuit board connected to the display device.

10. The electronic device of claim 9, wherein the display device includes:
a window member;
a display panel; and
a touch panel disposed between the display panel and the window member.

11. The electronic device of claim 10, wherein the IC chip includes one of a first driving chip for the touch panel and a second driving chip for the display panel.

12. The electronic device of claim 10, wherein the touch panel includes one of an electrostatic touch panel and a pressure sensitive touch panel.

13. The electronic device of claim 9, further comprising:
a support member partially interposed between the electronic component and the display device and disposed between the circuit board and the display device.

14. The electronic device of claim 13, wherein the circuit board is connected to the display device to bypass the support member.

15. The electronic device of claim 14, wherein the shielding member is disposed between the electronic component and the IC chip.

16. The electronic device of claim 15, wherein the shielding member includes:
an insulating film;
an electromagnetic shielding layer attached to the insulating film; and
a resin adhesive layer formed on the electromagnetic shielding layer,
wherein the resin adhesive layer includes a resin adhesive to which electrically conductive powder is added.

17. The electronic device of claim 16, wherein the shielding member further includes an insulating layer formed on the resin adhesive layer and facing the IC chip.

18. The electronic device of claim 16, wherein the resin adhesive layer includes a thermosetting resin adhesive.

19. The electronic device of claim 1, wherein the electronic component includes a speaker.

20. A method for manufacturing an electronic device, the method comprising:
forming radiating conductor in a portion of a side wall of a housing of the electronic device;
attaching an electronic component to the housing adjacent to the radiating conductor; and
attaching a shielding member connected to a circuit board including an integrated circuit (IC) chip to the housing such that shielding member surrounds the IC chip and is attached to at least one ground pad exposed along a periphery of a region in which the IC chip is mounted,
wherein the at least one ground pad and the IC chip adjacent to the at least one ground pad are configured to form a gap therebetween such that the gap is secured to be greater than or equal to half of a height of the IC chip adjacent to the at least one ground pad from one face of the circuit board.

* * * * *